(12) United States Patent
Adkisson et al.

(10) Patent No.: US 7,205,591 B2
(45) Date of Patent: Apr. 17, 2007

(54) PIXEL SENSOR CELL HAVING REDUCED PINNING LAYER BARRIER POTENTIAL AND METHOD THEREOF

(75) Inventors: James W. Adkisson, Jericho, VT (US); Andres Bryant, Burlington, VT (US); John Ellis-Monaghan, Grand Isle, VT (US); Jeffrey P. Gambino, Westford, VT (US); Mark D. Jaffe, Shelburne, VT (US); Jerome B Lasky, Essex Junction, VT (US); Richard A. Phelps, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,570

(22) Filed: Apr. 6, 2005

(65) Prior Publication Data

US 2006/0226456 A1 Oct. 12, 2006

(51) Int. Cl.
*H01L 27/148* (2006.01)
(52) U.S. Cl. .......... 257/233; 257/E27; 257/46
(58) Field of Classification Search ........... 257/215, 257/291, 223, E27.048
See application file for complete search history.

(56) References Cited

U.S. PATENT DOCUMENTS

| 6,465,820 | B1 | 10/2002 | Fox | |
| 6,660,553 | B2 | 12/2003 | Kimura et al. | |
| 6,744,084 | B2* | 6/2004 | Fossum | 257/292 |
| 6,909,126 | B1* | 6/2005 | Janesick | 257/184 |
| 2001/0011736 | A1 | 8/2001 | Dierickx | |
| 2003/0205741 | A1 | 11/2003 | Rhodes | |
| 2005/0023553 | A1 | 2/2005 | Rhodes | |
| 2005/0098806 | A1 | 5/2005 | Rhodes | |
| 2005/0230721 | A1* | 10/2005 | Patrick | 257/292 |
| 2006/0001060 | A1* | 1/2006 | Rhodes | 257/292 |
| 2006/0011919 | A1* | 1/2006 | Mouli | 257/69 |
| 2006/0118835 | A1* | 6/2006 | Ellis-Monaghan et al. | 257/292 |
| 2006/0124976 | A1* | 6/2006 | Adkisson et al. | 257/292 |
| 2006/0170009 | A1* | 8/2006 | Kitano et al. | 257/236 |

OTHER PUBLICATIONS

"Elimination of Parasitic Currents in Transistor-Schottky Barrier Diode Circuit", IBM Technical Disclosure Bulletin, vol. 19, No. 7, Dec. 1976, p. 2522.

* cited by examiner

*Primary Examiner*—Thao P. Le
(74) *Attorney, Agent, or Firm*—Anthony J. Canale (57) ABSTRACT

A pixel sensor cell structure and method of manufacture. The pixel cell comprises a doped layer formed adjacent to a first side of a transfer gate structure for coupling a collection well region and a channel region. Potential barrier interference to charge transfer caused by a pinning layer is reduced.

16 Claims, 9 Drawing Sheets

PIXEL SENSOR CELL HAVING REDUCED PINNING LAYER BARRIER POTENTIAL AND METHOD THEREOF

CROSS REFERENCE TO RELATED APPLICATIONS

The present invention is related to commonly-owned co-pending U.S. patent application Ser. No. 10/905,097 filed Dec. 15, 2004 and entitled A RECESSED GATE FOR AN IMAGE SENSOR, the whole contents and disclosure of which is incorporated by reference as if fully set forth herein.

FIELD OF THE INVENTION

The present invention relates generally to semiconductor pixel sensor cells, and more particularly, to a pixel sensor cell having improved carrier conduction between a collection well region and a gate channel region, and process therefore.

BACKGROUND OF THE INVENTION

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption can be restrained lower than that of CCD sensors, and further, CMOS logic circuits and like logic processing devices are easily integrated in the sensor chip and therefore the CMOS image sensors can be miniaturized.

Current CMOS image sensors comprise an array of pixel sensor cells, which are used to collect light energy and convert it into readable electrical signals. Each pixel sensor cell comprises a photosensitive element, such as a photodiode, photo gate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element to the floating diffusion region, and a transistor for resetting the floating diffusion region to a predetermined charge level prior to charge transfer.

Figure 1:
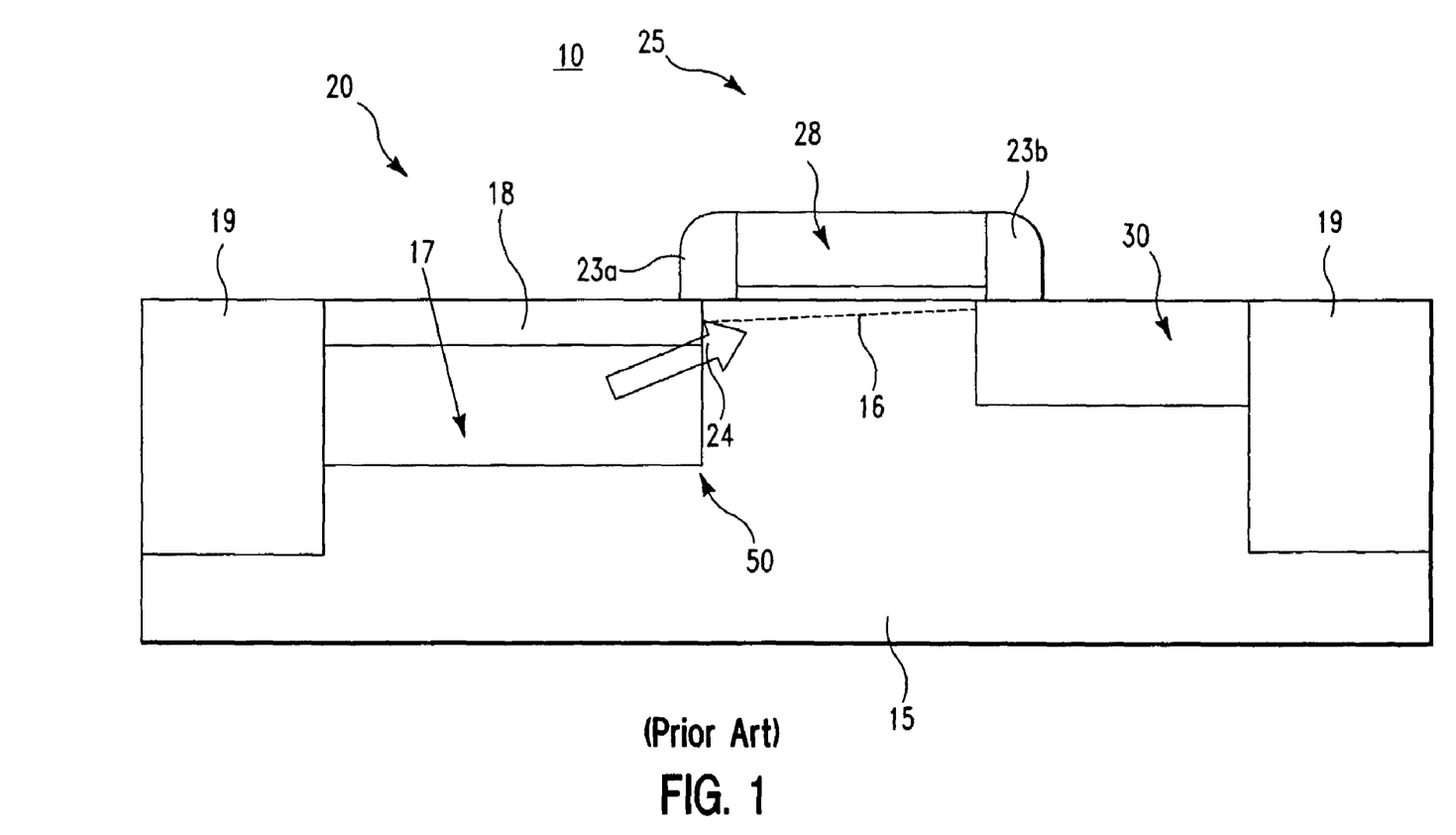
FIG. 1 depicts a CMOS image sensor pixel array 10 according to the prior art.

As shown in FIG. 1, a typical CMOS pixel sensor cell 10 includes a pinned photodiode 20 having a pinning layer 18 doped p-type and an underlying collection well 17 lightly doped n-type. Typically, pinned photodiode 20 is formed on top of a p-type substrate 15, or a p-type epitaxial layer or p-well surface layer, having a lower p-type concentration than pinning layer 18. N region 17 and p region 18 of photodiode 20 are typically spaced between an isolation region 19 and a charge transfer transistor gate 25 which is surrounded by thin spacer structures 23a,b. The photodiode 20 thus has two p-type regions 18 and 15 having a same potential so that the n region 17 is fully depleted at a pinning voltage (Vp). The pinned photodiode 20 is termed "pinned" because the potential in the photodiode 20 is pinned to a constant value, Vp, when the photodiode 20 is fully depleted. In operation, light coming from the pixel is focused down onto the photodiode and electrons collect at the n type region 17. When the transfer gate structure 25 is operated, i.e., turned on, the photo-generated charge 24 is transferred from the charge accumulating lightly doped n-type region 17 via a transfer device surface channel 16 to a floating diffusion region 30 which is doped n+ type.

A problem with these current CMOS imaging cells with a charge transfer gate 25 (e.g., a "4 Transistor" cell) is the definitional problem of controlling the readout of the charge. The p-type surface pinning layer 18 is necessary for low dark current, but can create a potential barrier between the n-type charge collection well 17 and the transfer device channel 16. The structure as currently practiced by the industry is also very sensitive to normal manufacturing process variations. Overlay and image size variation of the block masks is critical for cell operation.

For example, in conventional processes for fabricating the pinning layer 18 and collection well 17 in the prior art pixel sensor cell 10 shown in FIG. 1, a problem is that an end portion of the pinning layer 18 and an end portion of the collection well 17 are formed substantially aligned to each other (i.e. identified in FIG. 1 by edge 50) and somewhat overlap the transfer gate structure 25. The pinning layer 18 creates a relatively large potential barrier to charge transfer between the collection well 17 and the transfer device channel 16.

Prior art teaches the use of oblique-rotating implantation or the use of excessive thermal diffusion to position or move the n-type collection well dopant under the transfer gate structure 25 to minimize the potential barrier. U.S. Pat. No. 6,660,553 describes a method whereby an implant mask is used to form a collection well which is partly situated under the transfer gate structure. These conventional processes result in variations in the concentration distribution of the impurity dopant in the n-type collection well which can adversely affect the properties of the photodiode. Also, if the collection well overlaps the transfer gate structure too much, the transfer gate device will suffer from short channel effects. This effects the charge transfer efficiency of the transfer gate device which in turn may degrade performance of the CMOS image sensor.

Structures and methods that minimize the potential barrier created by the pinning layer and the parametric variability of the transfer gate are of great value for image sensors.

It would thus be highly desirable to provide a novel pixel sensor cell and method of manufacture whereby a potential barrier between the charge collection well and the transfer gate channel is reduced without adversely affecting the performance of the photodiode and the transfer gate.

SUMMARY OF THE INVENTION

The invention addresses a novel pixel sensor cell structure and method of manufacture. Particularly, a novel pixel sensor cell is fabricated whereby a potential barrier between the charge collection well and the transfer gate channel is reduced without adversely affecting the performance of the photodiode and the transfer gate.

According to an embodiment of the invention, the pixel sensor cell includes a doped p pinning layer, an n doped collection well region and an n doped layer that electrically couples the collection well region and the transfer gate channel. This improves the control of the readout of the charge of the imaging cell as the ability of the pinning layer to produce a potential barrier to charge transfer is reduced.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENTS

Embodiments of the invention are described herein below in terms of a "pixel sensor cell". It is noted that the term "pixel sensor cell" is used to generally refer to any type of sensor cell which is capable of converting incident electromagnetic radiation into an electrical signal. An example of a pixel sensor cell according to the invention includes a pixel sensor cell that is capable of detecting optical wavelengths of electromagnetic radiation and is commonly referred to as an "image sensor". An image sensor fabricated using CMOS technology is commonly referred to as a "CMOS image sensor".

Figure 2:
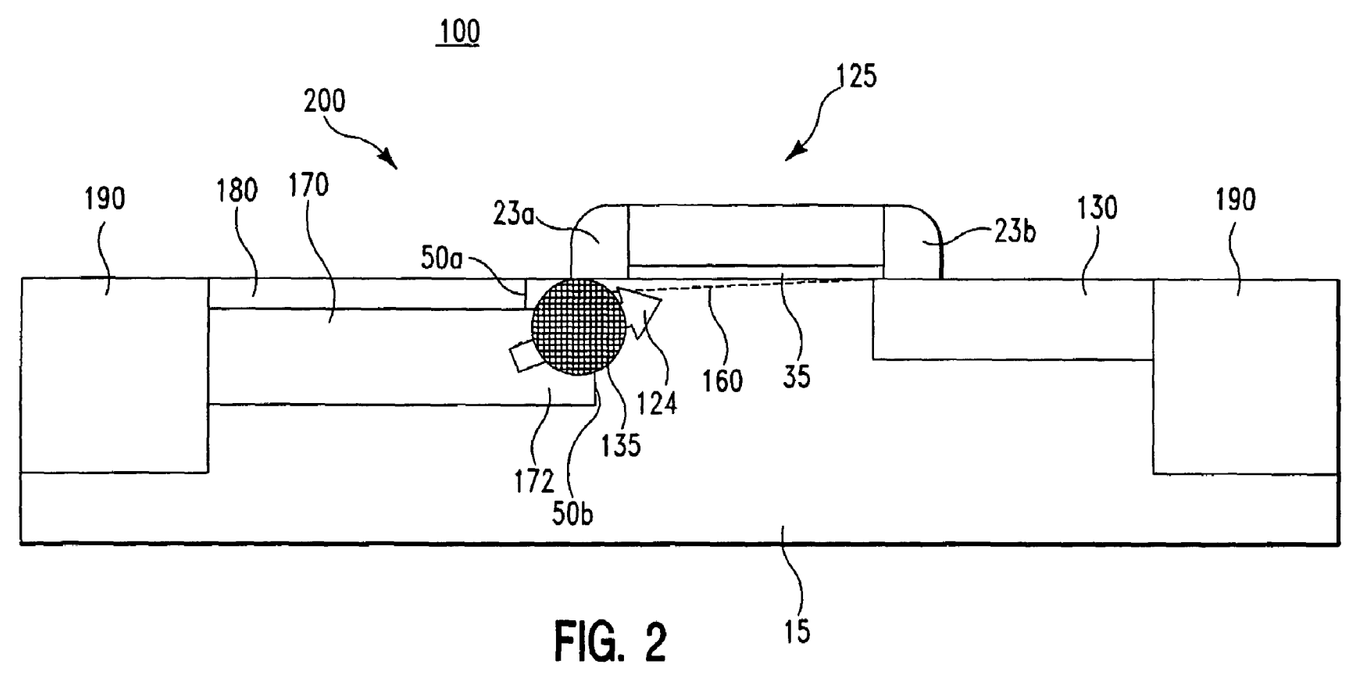
FIG. 2 illustrates a pixel sensor cell 100 of the present invention.

FIG. 2 illustrates the pixel sensor cell 100 of the present invention. As shown in FIG. 2, the pixel sensor cell 100 includes a transfer gate 125 formed on top of a gate dielectric material layer 35 which is formed on top of a semiconductor substrate 15. Between one side of the transfer gate 125 and isolation region 190 is a photodiode 200 comprising a surface pinning layer 180 doped with material of a first conductivity, e.g., p type material dopant, and a charge collection well region 170 doped with material of a second conductivity, e.g., n type material dopant, formed directly underneath the pinning layer 180. An edge 50a of the pinning layer 180 is formed spaced a further distance from the transfer gate channel 160 than an edge 50b of the charge collection well region 170.

Abutting the other side of the transfer gate 125 is a gate diffusion region 130 doped with material of a second conductivity, e.g., n type material dopant. As shown in FIG. 2, the transfer gate channel 160 is formed underneath the transfer gate 125. A doped layer 135 is also formed underneath a side of the transfer gate 125 and intersects a portion 172 of collection well region 170. In an embodiment of the invention, the doped layer 135 comprises a diffusion region doped with material of the same conductivity, e.g. n type material dopant, as the collection well region 170. The difference in alignment of edges 50a and 50b and the doped layer 135 help overcome the limitations of the prior art pixel sensor cell structure as the ability of the surface pinning layer 180 to produce a potential barrier to charge transfer is reduced and performance variations (i.e. short channel effects) in the transfer gate 125 are avoided. By forming edge 50a of the pinning layer 180 offset from edge 50b of the collection well region 170, excessive overlap of the collection well region 170 and the transfer gate 125 can be avoided. By forming doped layer 135 between the collection well region 170 and the transfer gate channel 160, the pinning layer 180 has less affect on charge transfer as it no longer intersects the path 124 of charge transfer. Thus, potential barrier interference from the pinning layer 180 is reduced.

Figure 3:
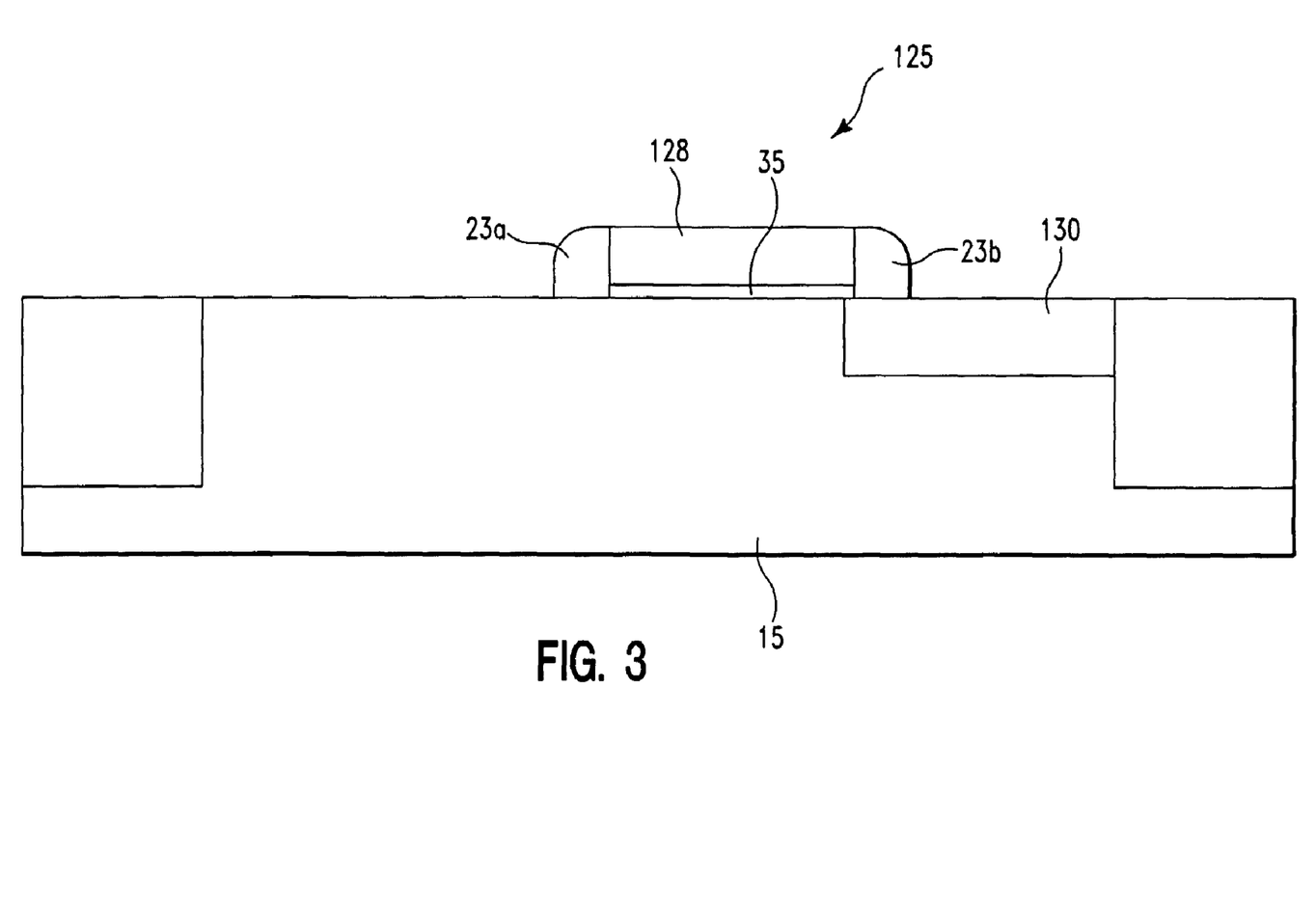
FIGS. 3–6 depict, through cross-sectional views, process steps according to an embodiment of the present invention for forming the pixel sensor cell 100 and resulting in the structure shown in FIG. 2; and, FIGS. 7–9 depict, through cross-sectional views, process steps according to another embodiment of the present invention for forming the pixel sensor cell 100 and resulting in the structure shown in FIG. 2.

The method to fabricate a pixel sensor cell according to an embodiment of the invention will be described. As shown in FIG. 3, there is provided a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III–V semiconductor), to a standard concentration ranging between, e.g., $1 \times 10^{14}$ to $1 \times 10^{16}$ atoms per $cm^3$. Next, transfer gate structure 125 is formed using standard processing techniques known in the art. For example, a dielectric material layer (not shown) is formed by standard deposition or growth techniques atop the substrate 15 that will form the eventual transfer gate dielectric 35. The dielectric layer is typically formed to a thickness ranging between 35 Å to 100 Å and may comprise suitable gate dielectric materials including but not limited to: an oxide (e.g., $SiO_2$), a nitride (e.g., silicon nitride) an oxynitride (e.g., Si oxynitride), $N_2O$, NO, $ZrO_2$, or other like materials. The dielectric layer is formed on the surface of the Si-containing semiconductor substrate 15 using conventional thermal oxidation or by a suitable deposition process such as chemical vapor deposition, plasma-assisted chemical vapor deposition, evaporation, sputtering and other like deposition processes. Although it is not shown, it is understood that the dielectric layer may comprise a stack of dielectric materials.

Next, a gate layer (not shown) is deposited above the dielectric material layer using conventional deposition processes including, but not limited to: CVD, plasma-assisted CVD, sputtering, plating, evaporation and other like deposition processes (e.g., a low pressure CVD). The gate layer may be comprised of any conductor including metals, silicides, or polysilicon. For purposes of description, an intrinsic polysilicon layer is used. The intrinsic polysilicon layer structure is formed atop the dielectric material layer surface to a thickness ranging between about 1 k Å to 2 k Å however, the thickness may be outside this range. It is understood that for proper operation, a polysilicon gate layer must be doped with the second conductivity type, e.g. n-type, to a concentration in the range of about $1 \times 10^{18}$ atoms per $cm^3$ to about $1 \times 10^{19}$ atoms per $cm^3$. This may be accomplished by the standard practice of utilizing the source/drain implants or by predoping the polysilicon before etch, or by using in situ doped polysilicon.

Regardless of whether or not the formed gate polysilicon layer is doped, e.g., subsequently by ion implantation or, in-situ doped and deposited, the transfer gate 125 is then formed to result in the structure shown in FIG. 3, whereby a photo lithographic process is used to define the transfer gate dielectric 35 and the transfer gate conductor 128. This step is not illustrated since there are many different ways how the lateral size and shape of the gate can be defined. Typically, an etch window is provided in a photo-resist mask (not shown), and one or more etch processes are performed, e.g., a reactive ion etch process, that is optimized to ensure proper etching of the doped polysilicon gate layer and dielectric material layer or dielectric layer stack. Chemical Mechanical Polish (CMP) techniques can also be used to define the transfer gate structure, and may be the preferred method when using metal gates.

In a further step (not shown), gate sidewall spacers 23a,b are formed at either side of the transfer gate 125 by conventional deposition processes known in the art, and may comprise any conventional oxide or nitride (e.g., $Si_3N_4$) or oxide/nitride, and then they are etched by RIE or another like etch process. The thickness of spacers 23a,b may vary, but typically they have a thickness of from about 10 nm to about 150 nm.

An n-type gate diffusion region 130 at one side of the transfer gate is then formed. This step (not shown) comprises forming a photoresist layer and patterning and etching an ion implantation mask according to techniques known in the art to form a mask edge approximately coincident with the gate edge or as close as possible given alignment tolerances, to provide an opening allowing the implantation of n-type dopant material, such as phosphorus, arsenic or antimony, at a concentration sufficient to form the n+-type gate diffusion region 130 as shown in the FIGS. up to the edge of the spacer 23b as shown in the structure depicted in FIG. 3. The active n+-type dopant material is ion implanted at the gate diffusion region 130 at dosing concentrations ranging between about $1\times10^{18}$ atoms per $cm^3$ and about $1\times10^{20}$ atoms per $cm^3$. It is noted that gate diffusion region 130 can be formed at other points in the process, for example, after formation of the photodiode 200 (described herein below).

Figure 4:
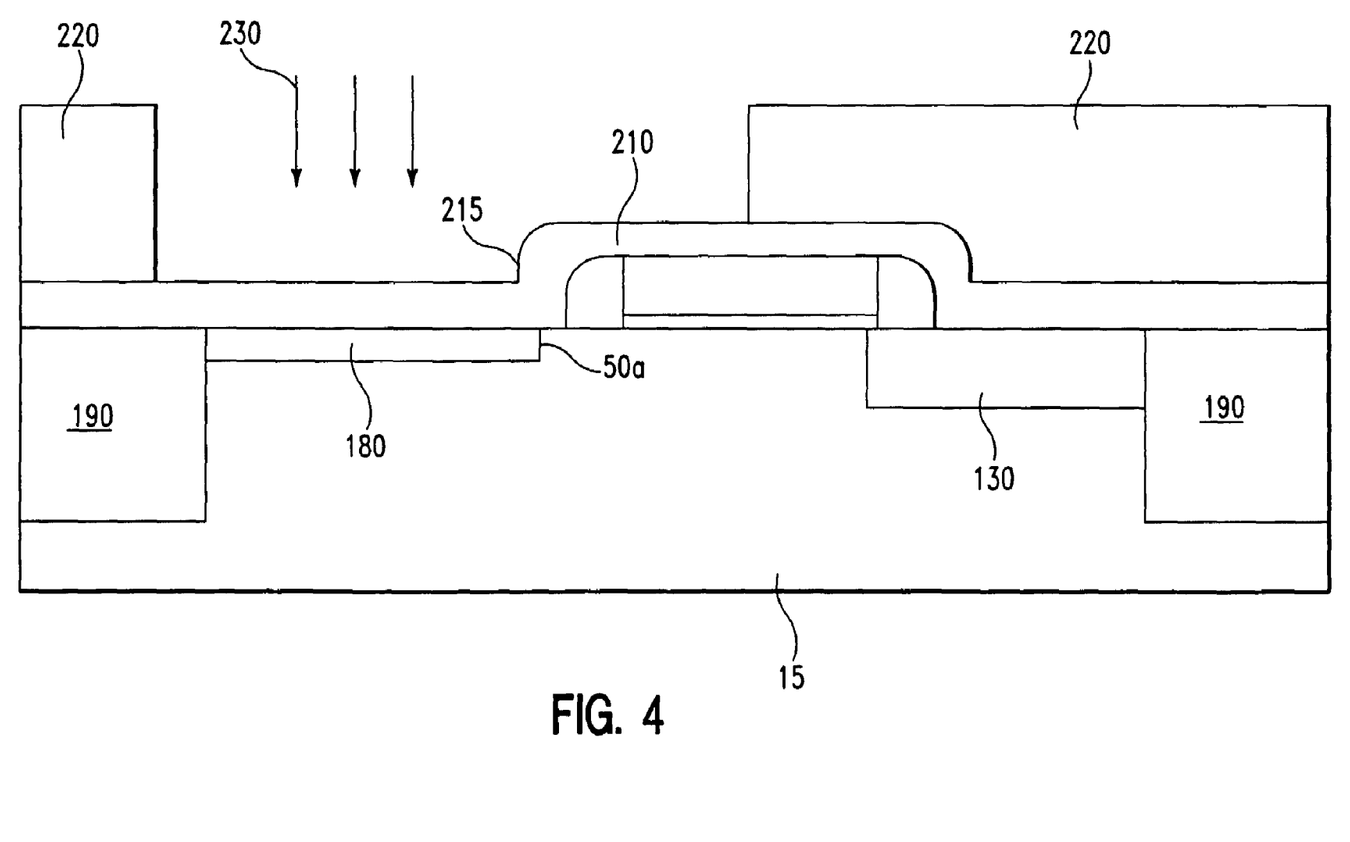

Referring to FIG. 4, a spacer layer 210 is formed atop the substrate 15 and transfer gate 125 using conventional deposition processes such as chemical vapor deposition. Spacer layer 210 is selected from a material that is capable of being removed by an etch process at a higher rate than the substrate 15 and spacers 23a, b. For example, spacer layer 210 may comprise borosilicate glass (BSG) and can be formed having a thickness in the range of about 10 nanometers (nm) to about 150 nm. In a subsequent step, a BSG spacer layer 210 can be removed selective to the substrate 15 and spacers 23a, b by processes known in the art such as, for example, a vapor HF etch.

Next, a photoresist layer is formed atop BSG spacer layer 210 and is patterned to form ion implantation mask 220 according to techniques known in the art to provide an opening to an area between an edge of the transfer gate 125 and isolation region 190, e.g., STI region, where the charge accumulation region of the photodiode 200 is to be formed. This opening permits the implantation of ions 230 of p-type dopant material such as boron at a concentration sufficient to form the p-type pinning layer 180 as shown in FIG. 4. The active p-type dopant material is ion implanted at dosing concentrations ranging between about $1\times10^{17}$ atoms per $cm^3$ and about $1\times10^{19}$ atoms per $cm^3$. It is noted that the edge 50a of pinning layer 180 is substantially aligned to an edge 215 of the BSG spacer layer 210. BSG spacer layer 210 acts to space edge 50a of pinning layer 180 further away from transfer gate channel 160 thus reducing barrier potential interference caused by the pinning layer 180.

Figure 5:
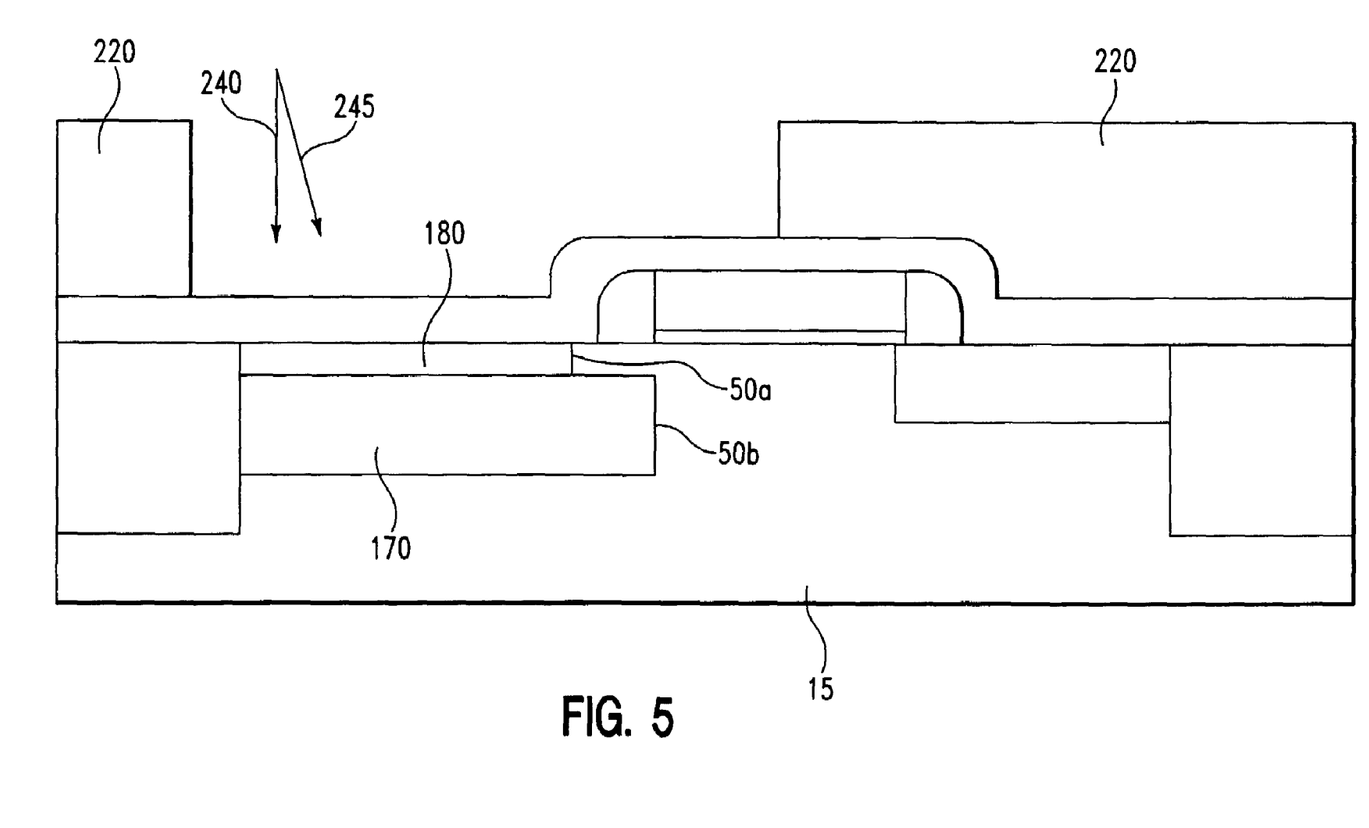

Referring to FIG. 5, using the same ion implantation mask 220 as in the previous step, an ion implantation process is performed to implant dopant material of the second conductivity type, e.g., n-type dopant material, such as phosphorus, arsenic or antimony, to form the charge collection well region 170 beneath the ion implanted p type pinning layer 180. The n-type dopant material is implanted at higher energy levels to form the n-type collection well region 170 of the photodiode 200 as shown in the FIGS. The active n-type dopant material is ion implanted at dosing concentrations ranging between about $1\times10^{16}$ atoms per $cm^3$ and about $1\times10^{18}$ atoms per $cm^3$. The collection well region 170 for collecting photo-generated electrons may be formed by multiple implants to tailor the profile of the n-type region 170. For example, collection well region 170 can be formed by a vertical ion implant 240 performed substantially normal (i.e. 90 degrees) to an upper surface of the substrate 15 and an angled ion implant 245 performed at an angle of about 1 degree to about 15 degrees to the upper surface of the substrate 15 to provide the edge 50b of collection well region 170 offset from the edge 50a of pinning layer 180. It is noted that the ion implants used to form both the pinning layer 180 and the collection well region 170 are performed at sufficient implant energy such that ions are implanted through the portion of BSG spacer layer 210 overlying the area where photodiode 200 is to be formed. Also, it should be understood that, alternatively, the p pinning layer 180 may be formed by other known techniques and may be formed subsequent to or before forming the collection well region 170. For example, the pinning layer 180 may be formed by a gas source plasma doping process, or by diffusing a p-type dopant from an in-situ doped layer or a doped oxide layer deposited over the area where photodiode 200 is to be formed.

Figure 6:
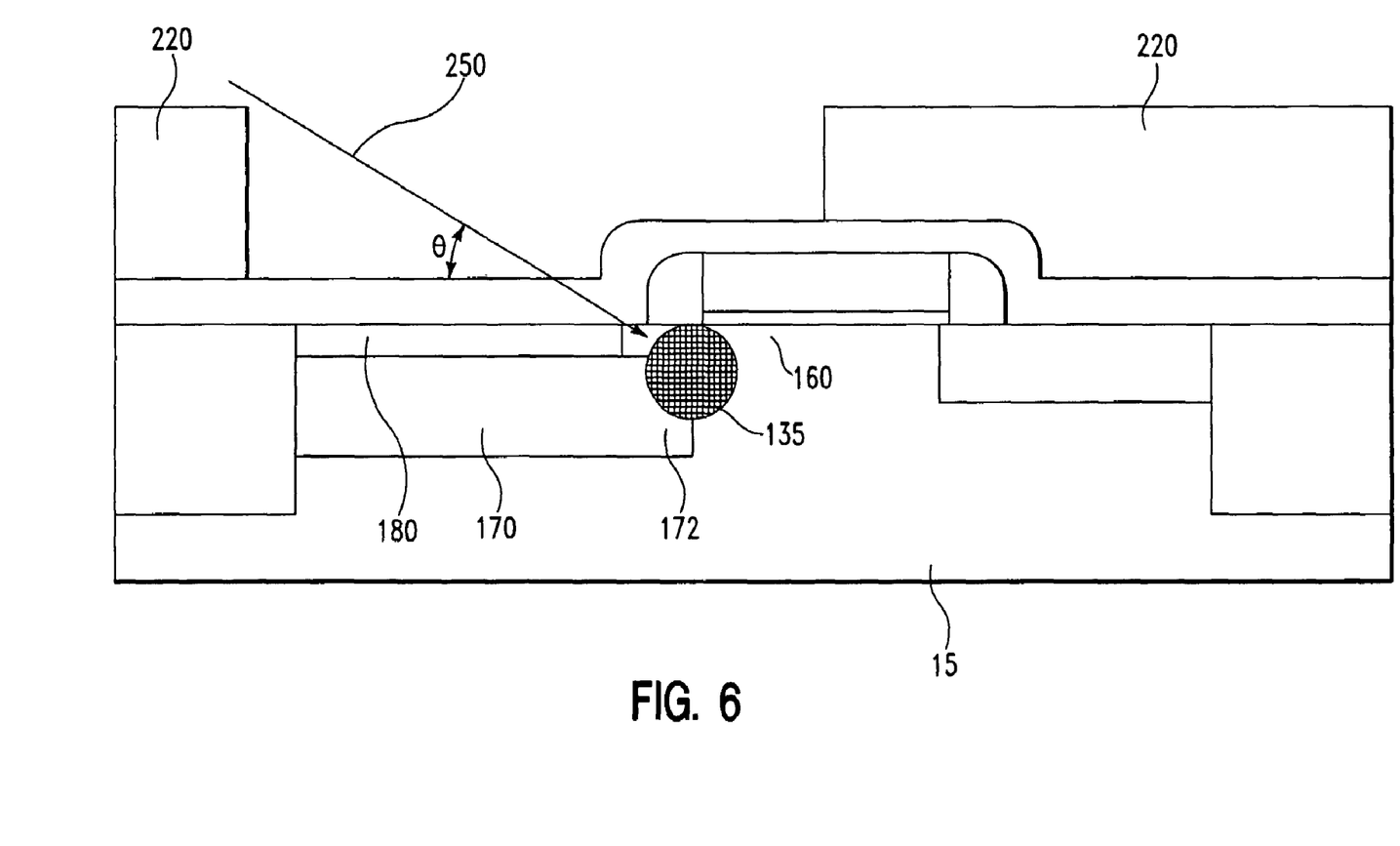

Referring to FIG. 6, doped layer 135 can be formed using the same ion implantation mask 220 as in the previous steps and performing an ion implant 250 of dopant material of the second conductivity type, e.g., n-type dopant material, such as phosphorus, arsenic or antimony. Ion implant 250 can be performed at an angle theta of about 15 degrees to about 45 degrees relative to the upper surface of the substrate 15 to form doped layer 135 beneath a side of the transfer gate 125 and in contact with a portion 172 of collection well region 170. Ion implant 250 provides a dopant concentration of about $1\times10^{17}$ to about $5\times10^{18}$ atoms/$cm^3$ in doped layer 135.

In an alternative embodiment of the invention, a method of forming collection well region 170 without requiring angled ion implant 245 is described herein below. An advantage of forming collection well region 170 using vertical ion implantation is that variations in the concentration distribution of the impurity dopant in the collection well region 170 are reduced which improves the performance of the photodiode 200.

Figure 7:
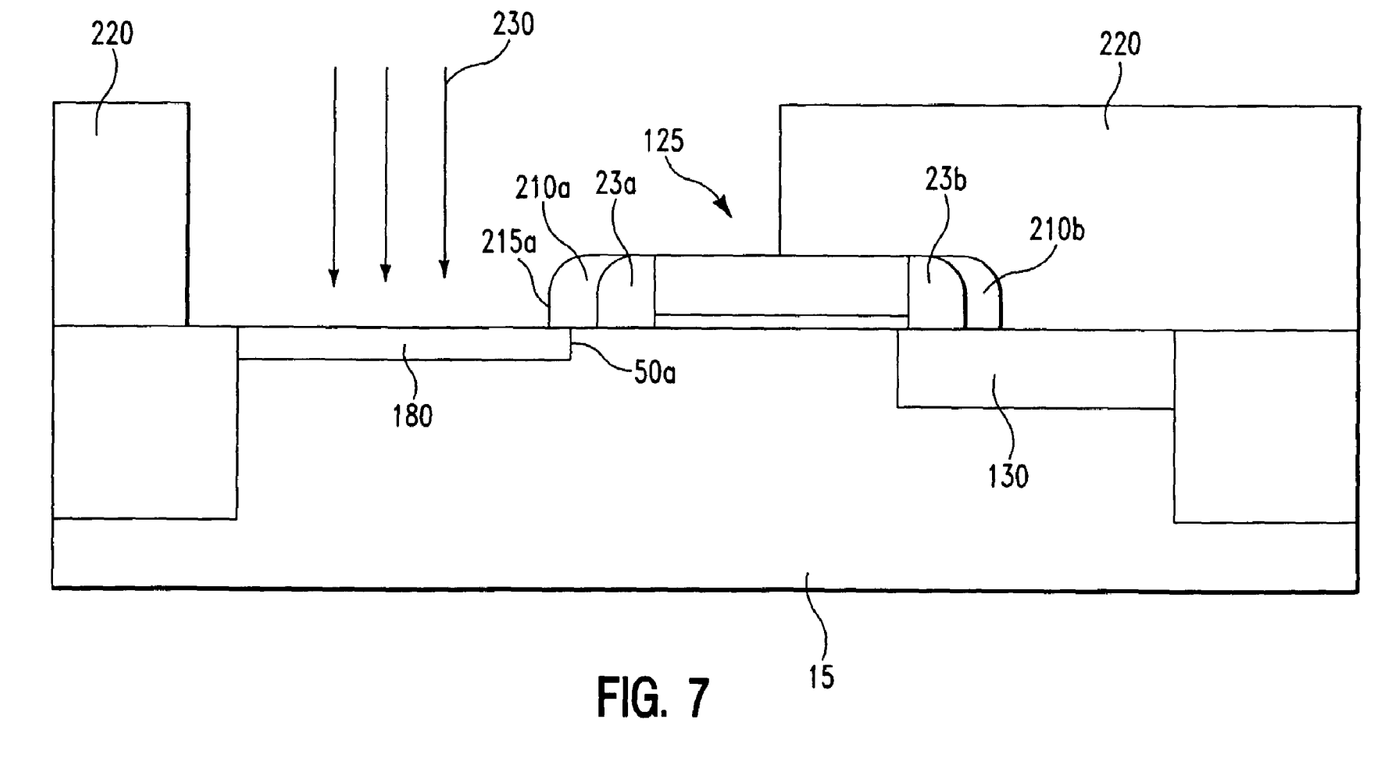
Figure 8:
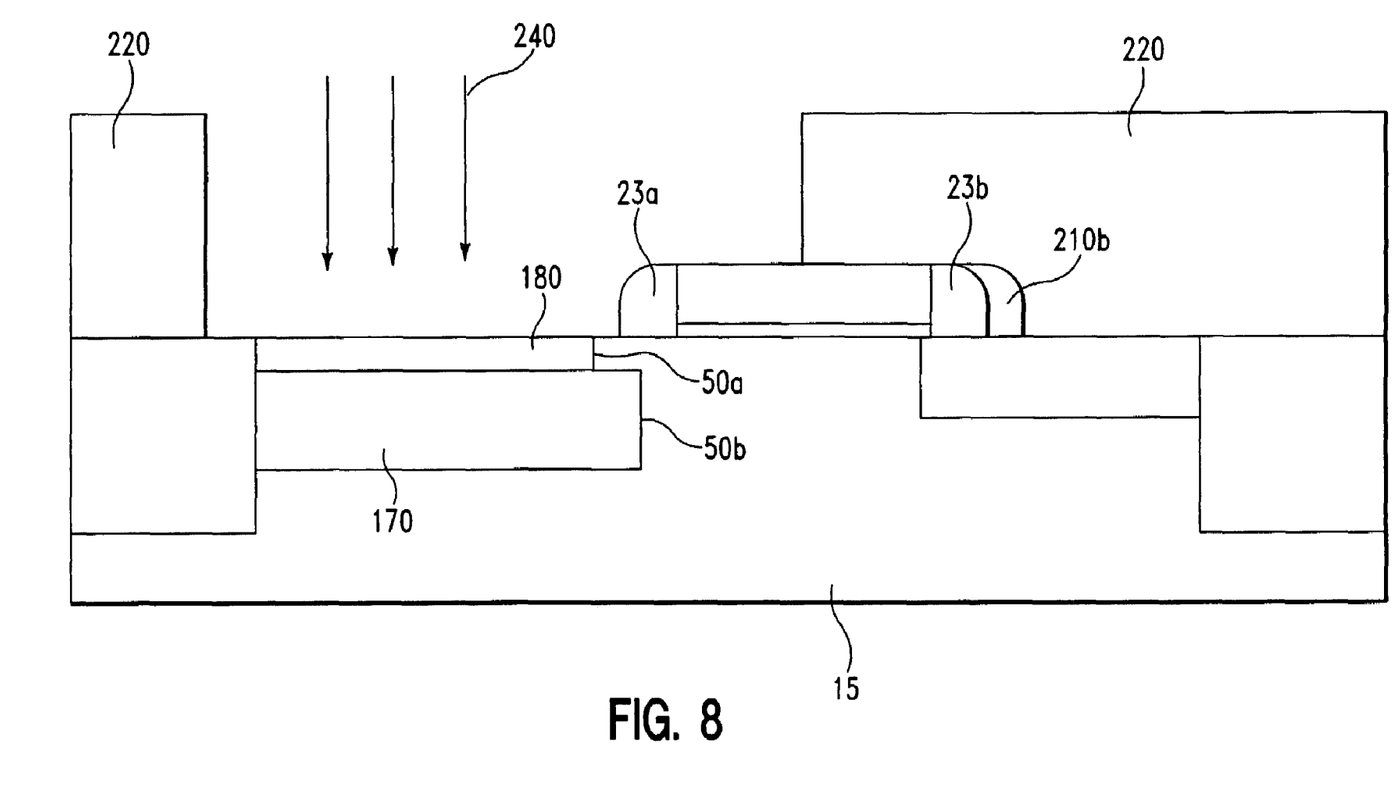
Figure 9:
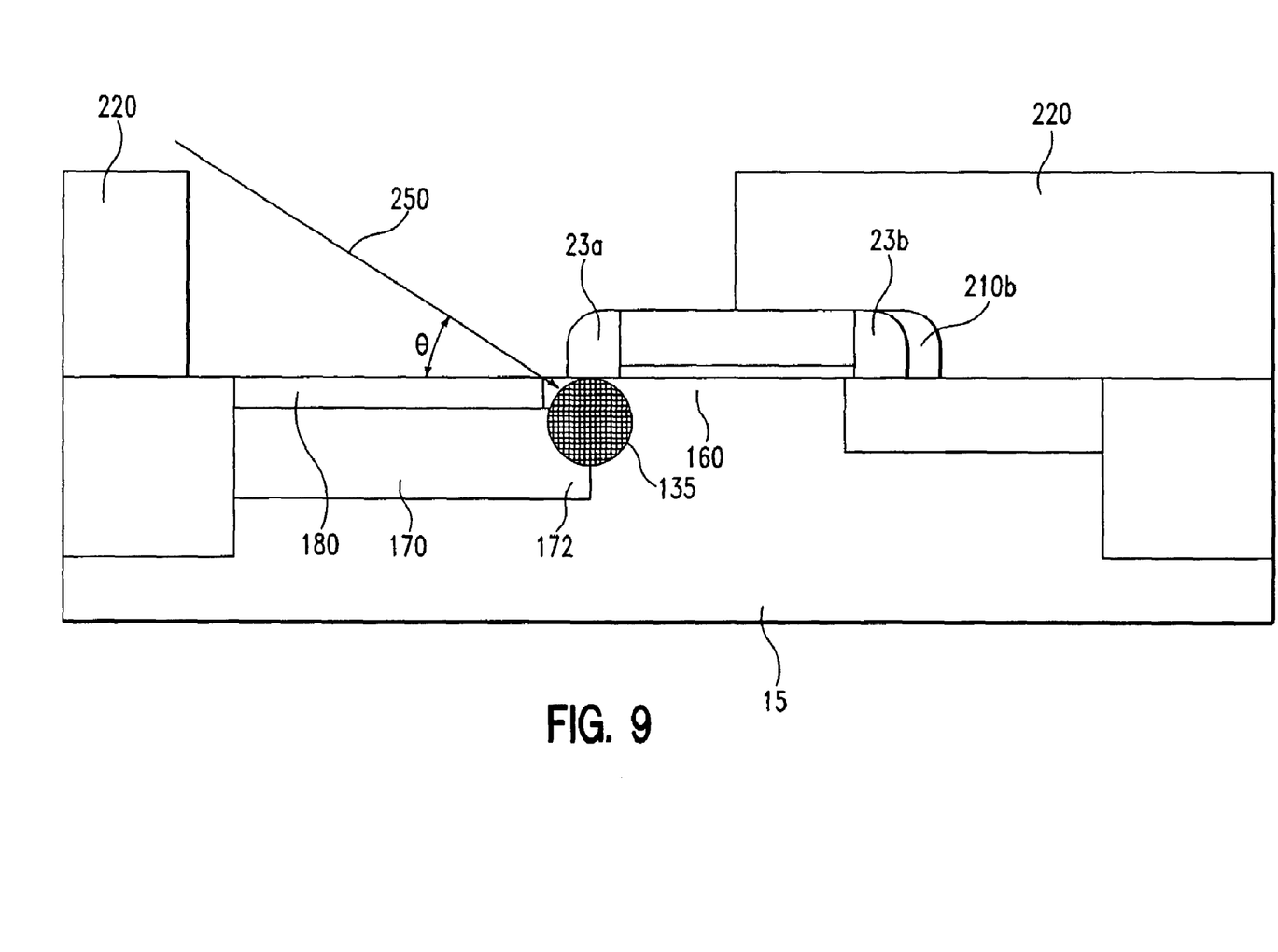

FIGS. 7–9 illustrate the alternative embodiment of the invention where similar structures are identified by the same numerals used in FIGS. 4–6. As such, for the purpose of this description, details such as ion implant energies, dosing concentrations, etc. are the same for the two embodiments and as such are not repeated in the following description relating to FIGS. 7–9 for the sake of clarity. Referring to FIG. 7, BSG spacer layer 210 is formed atop substrate 15 and transfer gate 125. Prior to forming ion implantation mask 220, BSG spacer layer 210 is etched by processes known in the art such as a reactive ion etch to form BSG spacers 210a, b having a thickness of about 10 nm to about 150 nm adjacent to spacers 23a, b, respectively. Ion implantation mask 220 is then formed and ions 230 of p-type dopant material are implanted to form the p-type pinning layer 180. It is noted that the edge 50a of pinning layer 180 is substantially aligned to an edge 215a of the BSG spacer 210a. BSG spacer 210a acts to space edge 50a of pinning layer 180 further away from transfer gate channel 160 thus reducing barrier potential interference caused by the pinning layer 180.

Referring to FIG. 8, using the same ion implantation mask 220 as in the previous step, BSG spacer 210a is removed by processes known in the art such as a vapor HF etch selective to substrate 15 and spacer 23a. Next, a vertical ion implant 240 is performed to implant dopant material of the second conductivity type, e.g., n-type dopant material, to form the charge collection well region 170 beneath the ion implanted p type pinning layer 180. Removal of BSG spacer 210a and vertical ion implant 240 forms the edge 50b of collection well region 170 offset from the edge 50a of pinning layer 180. As was noted with reference to FIGS. 4–6, the p pinning layer 180 may be formed by other known techniques and may be formed subsequent to or before forming the collection well region 170. For example, the p surface layer 180 may be formed by a gas source plasma doping process, or by diffusing a p-type dopant from an in-situ doped layer or a doped oxide layer deposited over the area where photodiode 200 is to be formed. FIG. 9 shows doped layer 135 formed using the same ion implantation mask 220 as in the previous steps and performing an angle ion implant 250 of dopant material of the second conductivity type, e.g., n-type dopant material, beneath a side of the transfer gate 125 and in contact with a portion 172 of collection well region 170.

While there has been shown and described what is considered to be preferred embodiments of the invention, it will, or course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A pixel sensor cell comprising:
   a substrate including a gate structure formed on the substrate;
   a first doped region forming a collection well region of a first conductivity type beneath a surface of said substrate adjacent to a first side of said gate structure;
   a pinning layer of a second conductivity type formed atop said collection well layer at a surface of said substrate adjacent to said first side;
   a gate diffusion region of a first conductivity type formed adjacent a second side of said gate structure;
   a channel region of said gate structure for enabling charge transfer between said collection well region and said gate diffusion region; and
   a second doped region different than said first doped region forming a doped layer of said first conductivity type adjacent to said first side of said gate structure for coupling said collection well region and said channel region to reduce potential barrier interference to charge transfer caused by said pinning layer.

2. The pixel sensor cell of claim 1, wherein an edge of said collection well region located adjacent to said first side is closer in proximity to said channel region than said corresponding edge of said pinning layer.

3. The pixel sensor cell of claim 1, wherein said doped layer intersects at least a portion of said collection well region.

4. The pixel sensor cell of claim 1, wherein carriers generated in said collection well region are electrically conducted from said collection well region through said doped layer to said channel region.

5. The pixel sensor cell of claim 1, wherein said doped layer is formed beneath said first side of said gate structure.

6. A CMOS image sensor including an away of pixels, at least one pixel including a pixel sensor cell structure comprising:
   a substrate including a gate structure formed on the substrate;
   a first doped region forming a collection well region of a first conductivity type beneath a surface of said substrate adjacent to a first side of said gate structure;
   a pinning layer of a second conductivity type formed atop said collection well layer at a surface of said substrate adjacent to said first side;
   a gate diffusion region of a first conductivity type formed adjacent a second side of said gate structure;
   a channel region of said gate structure for enabling charge transfer between said collection well region and said gate diffusion region; and
   a second doped region different than said first doped region forming a doped layer of said first conductivity type adjacent to said first side of said gate structure for coupling said collection well region and said channel region to reduce potential barrier interference to charge transfer caused by said pinning layer.

7. The CMOS image sensor of claim 6, wherein an edge of said collection well region located adjacent to said first side is closer in proximity to said channel region than said corresponding edge of said pinning layer.

8. The CMOS image sensor of claim 6, wherein said doped layer intersects at least a portion of said collection well region.

9. The CMOS image sensor of claim 6, wherein carriers generated in said collection well region are electrically conducted from said collection well region through said doped layer to said channel region.

10. The CMOS image sensor of claim 6, wherein said doped layer is formed beneath said first side of said gate structure.

11. The pixel sensor cell of claim 1, wherein said doped layer is in direct physical contact with said channel region.

12. The CMOS image sensor of claim 6, wherein said doped layer is in direct physical contact with said channel region.

13. The pixel sensor cell of claim 1, wherein said first doped region comprises a first ion implanted region and said second doped region comprises a second ion implanted region different than said first ion implanted region.

14. The pixel sensor cell of claim 1, wherein said first doped region comprises dopant at a first dopant concentration and said second doped region comprises dopant at a second dopant concentration.

15. The CMOS image sensor of claim 6, wherein said first doped region comprises a first ion implanted region and said second doped region comprises a second ion implanted region different than said first ion implanted region.

16. The CMOS image sensor of claim 6, wherein said first doped region comprises dopant at a first dopant concentration and said second doped region comprises dopant at a second dopant concentration.

* * * * *